United States Patent [19]

Long

[11] 4,171,515

[45] Oct. 16, 1979

[54] MIXER TERMINATION FOR FLAT FREQUENCY RESPONSE

[75] Inventor: Gordon D. Long, Portland, Oreg.

[73] Assignee: Tektronix, Inc., Beaverton, Oreg.

[21] Appl. No.: 932,251

[22] Filed: Aug. 9, 1978

[51] Int. Cl.² .............................................. H04B 1/26
[52] U.S. Cl. ..................................... 325/436; 325/381
[58] Field of Search ............... 325/376, 377, 379, 381, 325/383, 388, 430, 435, 436, 437, 438, 439, 442, 445, 446; 330/4.5, 4.9

[56] References Cited

U.S. PATENT DOCUMENTS 3,737,784  6/1973  Dostis .................................. 325/436

Primary Examiner—Marc E. Bookbinder
Attorney, Agent, or Firm—William D. Haffner

[57] ABSTRACT

A circuit that improves the frequency response of a mixer but does not reduce mixer sensitivity is disclosed. The circuit provides a wideband constant source impedance for the mixer input through the use of a frequency diplexer.

3 Claims, 4 Drawing Figures

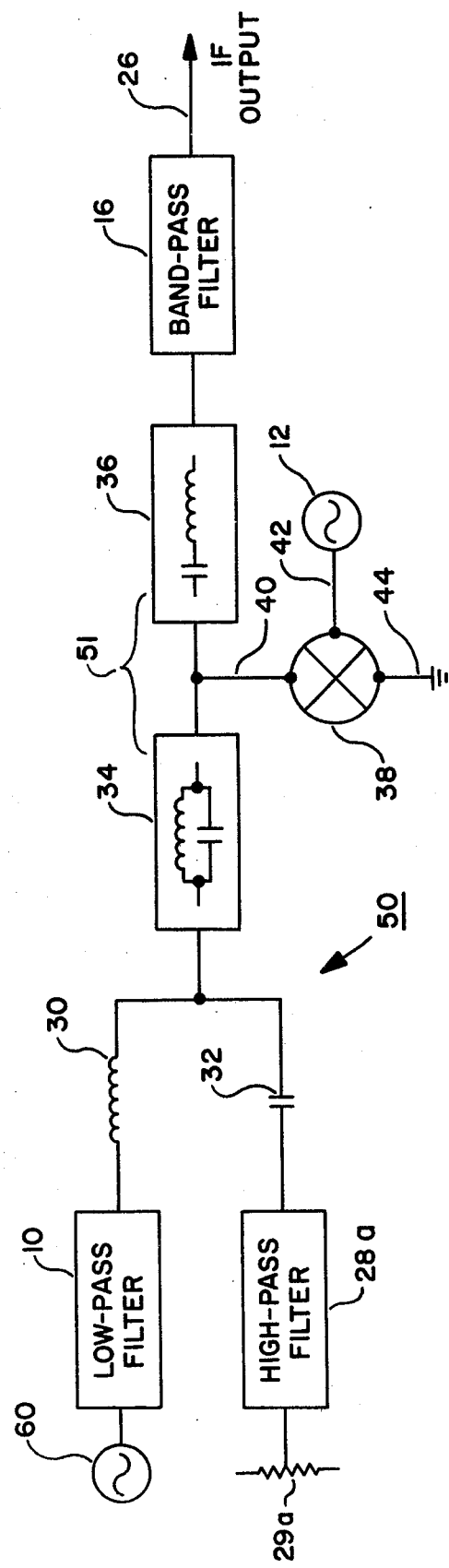

MIXER TERMINATION FOR FLAT FREQUENCY RESPONSE

BACKGROUND OF THE INVENTION

This invention is in the field of broad band active circuits and more specifically broad band mixers.

A mixer is a threeport device, having a signal (RF) input, local oscillator (LO) input, and an intermediate-frequency (IF) output. An ideal mixer simply translates the input signal, leaving everything else unchanged. In actual use, harmonic and product signals are generated in the mixing process. In conventional mixer arrangements, these signals may undergo additional mixing and cause variations in the mixer's conversion-loss flatness as a function of frequency. Mixers that operate over a broad frequency range at one input and a narrow frequency range at another output and use reactive filters at these ports are especially susceptible to the above problem. This is the result of impedance mismatches between the filters and the mixer terminals.

Prior methods of correcting for this problem usually add a resistive attenuator in the signal path to better match impedances and reduce reflected signals. Obviously, this technique degrades mixer sensitivity by the amount of the signal attenuation added.

U.S. Pat. No. 3,737,784 to Dostis describes a system wherein broadband impedance matching is provided at mixer terminals by using directional filters. However, the approach taken by Dostis does not solve some problems. For example, if one terminal is connected to a signal input that varies from DC to some upper limit the described directional filter cannot be used. Also, there are certain instances when a directional filter cannot produce the required bandpass width and shape.

SUMMARY OF THE INVENTION

This invention improves mixer operation by matching the impedance between mixer ports and the filters connected thereto. This is accomplished by the addition of a frequency diplexer having high-pass and low-pass parts at the mixer input.

An object of this invention is to provide means of mixer termination that improves frequency response and does not add signal attenuation.

Another object is to provide a termination system that provides flat frequency responsive over a broad frequency band.

The subject matter of the present invention is particularly pointed out and distinctly claimed in the following description. The invention, however, both as to organization and method of operation together with further advantages and objects thereof may best be understood by reference to the following description taken in conjunction with the accompanying drawings wherein like reference numerals refer to like elements. It is to be understood that these embodiments are not intended to be exhausting nor limiting of the invention but are for the purpose of illustration in order that others skilled in the art may fully understand the invention and principles thereof and the manner of applying it in a particular use so that they may modify it in various ways, each as may best be suited to the conditions of the particular use.

BRIEF DESCRIPTION OF THE DRAWINGS

In the drawings:

FIG. 4 is a block diagram of a single-balanced mixer utilizing the present invention.

DETAILED DESCRIPTION OF THE INVENTION

Figure 1:
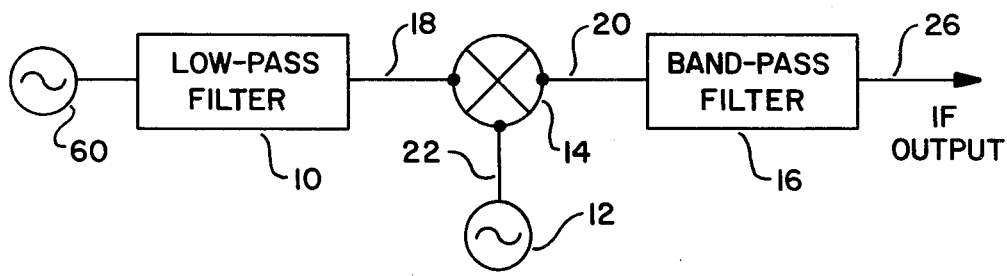
FIG. 1 is a block diagram of a conventional doublebalanced mixer.

FIG. 1 illustrates a conventional double-balanced mixer. To better understand the present invention, consider the following description of mixer operation.

Port 18 of double-balanced mixer 14 is coupled through low pass filter 10 to a signal source 60. A second port 22 of mixer 14 is connected to a local oscillator 12. The third port 20 of mixer 14 is coupled through a band pass filter 16 to output line 26. At the mixer, the input signal is algebraically combined with the local oscillator signal is produce the desired intermediate frequency output. The mixing process is nonlinear and, consequently, as mentioned above it generates signals that are harmonics and products of the input signals. In the conventional mixer shown in FIG. 1 these harmonic and product signals produce variations in the output signal frequency responses.

Considering mixer port 18, input signals within the passband of low-pass filter 10 pass through to the mixer where they are combined with the local oscillator signal to produce the desired IF output signal. The IF output signal passes through the band pass filter 16 to output line 26. The mixing process converts an input frequency into a double sideband output signal. One sideband is the desired IF output frequency and is selected by band pass filter 16. The other sideband is either passed or reflected in varying amounts by filter 16. This signal is reflected back to the mixer. This reflected signal is also mixed and two new signals are produced. These two signals can be reflected by input filter 10 and mixed again by the mixer to produce a reduced-level version of the desired IF signal. This undesired low-level signal is of arbitrary phase relative to the desired IF signal and, thus, causes variations in the mixer frequency response.

Figure 2:
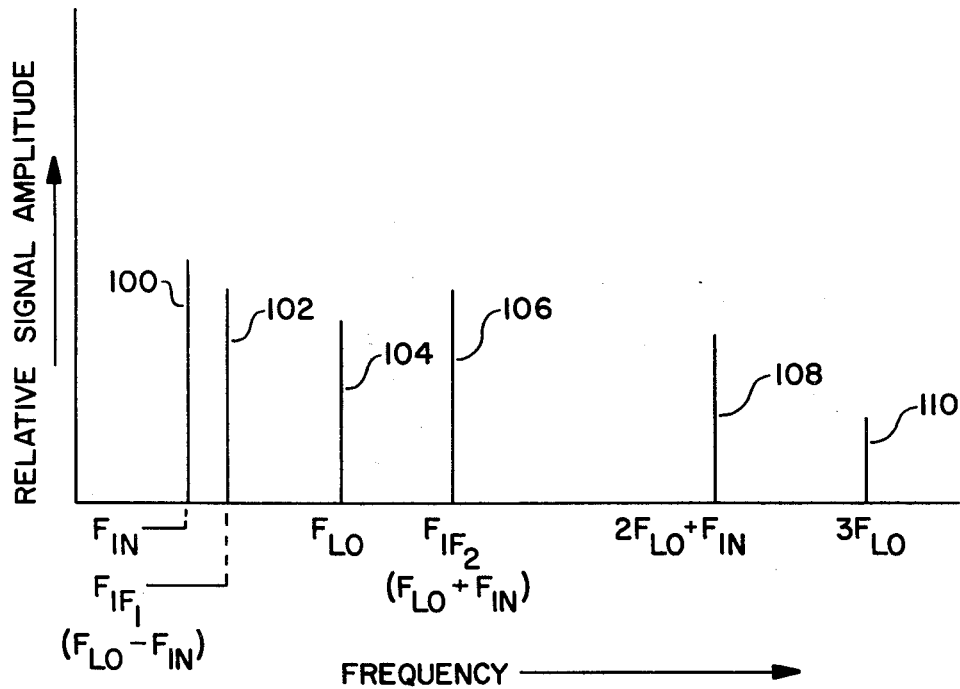
FIG. 2 is a graph of the various signals involved in the mixing process.

FIG. 2 shows some of the specific frequencies involved in the mixing process. The first frequency shown is the input frequency 100 ($F_{IN}$) which is added algebraically to the local oscillator frequency 104 ($F_{LO}$) to produce the two intermediate frequencies 102 and 106 ($F_{IF1}$ and $F_{IF2}$). Frequency 102 is the frequency band pass filter 16 is designed to pass out of the mixer as the intermediate frequency. The other intermediate frequency 106 is outside the passband of filter 16; therefore, it is reflected back into the mixer where it is mixed with $F_{LO}$ to produce two new frequencies:

$$f_1 = F_{IF2} + F_{LO}$$

$$f_1 = (F_{LO} + F_{IN}) + F_{LO}$$

$$f_1 = 2F_{LO} + F_{IN} \qquad (1)$$

and $$f_2 = F_{IF2} - F_{LO}$$

$$f_2 = (F_{LO} + F_{IN}) - F_{LO}$$

$$f_2 = F_{IN} \quad (2)$$

Frequency $f_2$ does not cause a problem since it is terminated in the output impedance of the input signal source. However, the other signal, $f_1$, can mix with the third harmonic of the local oscillator frequency, $3F_{LO}$ to produce two additional frequencies:

$$f_3 = 3F_{LO} + (2F_{LO} + F_{IN})$$

$$f_3 = 5F_{LO} + F_{In} \quad (3)$$

and $$f_4 = 3F_{LO} - (2F_{LO} + F_{IN})$$

$$f_4 = F_{LO} - F_{IN}$$

$$f_4 = F_{IF} \quad (4)$$

Since frequency $f_4$ is the same as the intermediate frequency it will perturb the frequency response of the mixer by adding to or subtracting from the amplitude of the output signal. This causes amplitude variations in the output signal.

Figure 3:
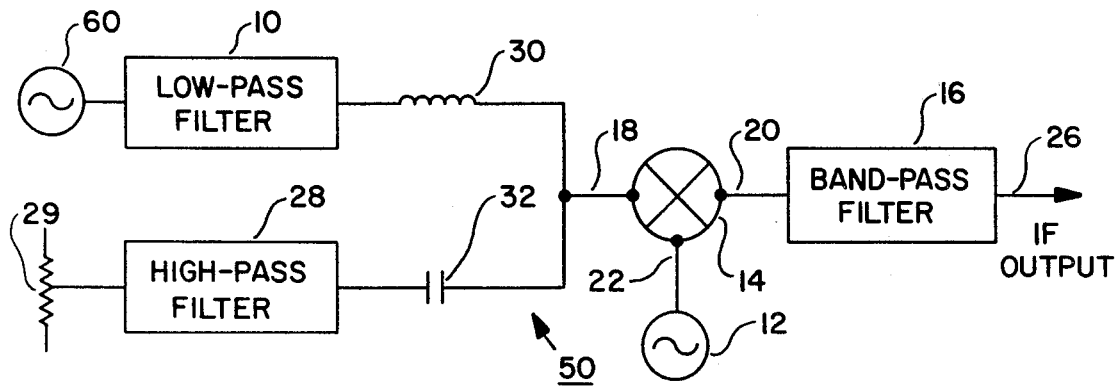
FIG. 3 is a block diagram of a double-balanced mixer utilizing the present invention.

FIG. 3 shows a mixer arranged according to the preferred embodiment of the present invention. Added to the conventional arrangement of FIG. 1 is a high pass filter 28 and a frequency diplexer 50 comprising capacitor 32 and inductor 30. High pass filter 28 is terminated in resistance 29 and connected to port 18 of mixer 14 through one port of diplexer 50 and low pass filter 10 is connected to port 18 of mixer 14 through the other port. Filters and diplexers which may be adapted for use in accordance with the present invention are well known in the art. Those desiring design information for these components are referred to texts such as the "Microwave Engineers Handbook" edited by T. S. Saad, Artech House, Inc., 1971.

Basic operation of the preferred embodiment of FIG. 3 is similar to that described for the arrangement shown in FIG. 1. Therefore, only the differences in operation will be described here.

In order to eliminate the undesirable effects of the spurious frequencies produced by the conventional mixer 14, diplexer 50 separates these signals into two components. Those signals at the frequency of the input signal, $F_{IN}$, are routed through low pass filter 10 which is terminated or matched, as before, in the source impedance of the input signal source. The passband of high pass filter 28 is such that all signals of frequencies higher than $2F_{IF}$ are terminated in resistive impedance 29 which is matched to the source impedance of port 18 at frequencies within the passband of highpass filter 28; thus, eliminating reflections. Since there are no reflections of signals above $2F_{IF}$, it follows that the offending intermediate frequency component $f_4$ will not be produced and the mixer frequency responses will be flat.

It is not intended that the passband of high pass filter 28 be restricted only to frequencies above $2F_{IF}$; alternatively filter 28 may be a band pass filter. The filter characteristics may be altered to fit the requirements of each particular application. The values of inductor 30 and capacitor 32 are selected to maintain a flat frequency response characteristic for filter 10 and to match the impedance between filter 28 and mixer port 18.

Although the above description was made only on one preferred embodiment of the present invention, it is apparent to those skilled in the art that various modifications can be made. For example, the preferred embodiment used a double-balanced mixer, but a single-balanced mixer may be used. FIG. 4 shows a single-balanced mixer using the present invention. Because of the well-known operating characteristics of the single-balanced mixer, diplexer 51 is required to isolate the input signal from the output intermediate frequency signal. Also, in this embodiment, high pass filter 28a must include in its passband all frequencies above $F_{IF}$. Thus, all signals above $F_{IF}$ are resistively terminated by filter 28a and resistor 29a and the output frequency response of the mixer is flat. Therefore, the appended claims are intended to cover all such changes and modifications that fall within the scope and true spirit of the invention.

What is claimed is:

1. A mixer termination system with improved frequency response, the system comprising:
   a three-port mixer for combining a first signal with a second signal to produce an output signal;
   a first signal source for generating said first signal, said first signal source connected to a first port of said mixer;
   a second signal source for generating said second signal;
   a three-port frequency diplexer having a first port connected to a second port of said mixer;
   a low pass filter connected between a second port of said frequency diplexer and said second signal source, said low pass filter being matched to the source impedance of said second signal source;
   a band pass filter connected to a third port of said mixer for passing said output signal; and
   a filter connected to a third port of said frequency diplexer, said filter including a resistive termination matched to the source impedance of said second port of said three-port mixer at frequencies within the passband of said filter.

2. The mixer termination system according to claim 1, wherein said filter connected to a third port of said frequency diplexer comprises a high pass filter.

3. The mixer termination system according to claim 1, wherein said filter connected to a third port of said frequency diplexer comprises a band pass filter.

* * * * *

UNITED STATES PATENT AND TRADEMARK OFFICE
CERTIFICATE OF CORRECTION

PATENT NO. : 4,171,515
DATED : October 16, 1979
INVENTOR(S) : Gordon David Long

It is certified that error appears in the above-identified patent and that said Letters Patent are hereby corrected as shown below:

Column 1, line 18, "output" should be --input--.

Column 1, line 44, "provide means of" should be --provide a means of--.

Column 2, line 2, "blebalanced" should be --ble-balanced--.

Column 2, line 21, "signal is produce" should be --signal to produce--.

Column 2, line 27, "responses" should be --response--.

Signed and Sealed this

Eighth Day of January 1980

[SEAL]

Attest:

SIDNEY A. DIAMOND

Attesting Officer

Commissioner of Patents and Trademarks